(12) United States Patent
Wang

(10) Patent No.: US 7,981,697 B2
(45) Date of Patent: *Jul. 19, 2011

(54) CURRENT-CONFINED EFFECT OF MAGNETIC NANO-CURRENT-CHANNEL (NCC) FOR MAGNETIC RANDOM ACCESS MEMORY (MRAM)

(75) Inventor: Jianping Wang, Shoreview, MN (US)

(73) Assignee: Avalanche Technology, Inc., Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/791,737

(22) Filed: Jun. 1, 2010

(65) Prior Publication Data

US 2010/0240152 A1    Sep. 23, 2010

Related U.S. Application Data

(63) Continuation of application No. 11/932,940, filed on Oct. 31, 2007, now Pat. No. 7,732,881.

(60) Provisional application No. 60/863,812, filed on Nov. 1, 2006.

(51) Int. Cl.
*H01L 21/00*   (2006.01)

(52) U.S. Cl. ............. 438/3; 438/63; 257/421; 257/295; 257/E27.006; 257/E21.665; 365/158; 365/171; 365/173

(58) Field of Classification Search ................ 438/3, 63; 257/421, E27.006, 295, E21.665; 365/158, 365/171, 173
See application file for complete search history.

(56) References Cited

U.S. PATENT DOCUMENTS

| 7,732,881 B2* | 6/2010 | Wang | 257/421 |
| 2002/0054462 A1* | 5/2002 | Sun et al. | 360/324.2 |
| 2005/0185455 A1* | 8/2005 | Huai | 365/171 |
| 2006/0256484 A1* | 11/2006 | Sato et al. | 360/324.2 |
| 2008/0061388 A1* | 3/2008 | Diao et al. | 257/421 |
| 2008/0062581 A1* | 3/2008 | Parkin | 360/324.11 |

OTHER PUBLICATIONS

Meng et al., Composite free layer for high density magnetic random access memory with low spin transfer current, Applied Physics Letters 89, 152509, Oct. 12, 2006.*

* cited by examiner

*Primary Examiner* — Tu-Tu V Ho
(74) *Attorney, Agent, or Firm* — Maryam Imam; IPxLAW Group LLP

(57) ABSTRACT

One embodiment of the present invention includes a memory element having a composite free layer including a first free sub-layer formed on top of the bottom electrode, a nano-current-channel (NCC) layer formed on top of the first free sub-layer, and a second free sub-layer formed on top of the NCC layer, wherein when switching current is applied to the memory element, in a direction that is substantially perpendicular to the layers of the memory element, local magnetic moments of the NCC layer switch the state of the memory element.

37 Claims, 7 Drawing Sheets

CURRENT-CONFINED EFFECT OF MAGNETIC NANO-CURRENT-CHANNEL (NCC) FOR MAGNETIC RANDOM ACCESS MEMORY (MRAM)

CROSS REFERENCE TO RELATED APPLICATIONS

This application is a continuation-in-part of U.S. patent application Ser. No. 11/932,940, filed on Oct. 31, 2007, by Jianping Wang and entitled "Current-Confined Effect of Magnetic Nano-Current-Channel (NCC) For Magnetic Random Access Memory (MRAM)", which claims priority from my previously-filed U.S. Provisional Application No. 60/863,812, entitled "Novel Spintronic Device", filed on Nov. 1, 2006.

BACKGROUND OF THE INVENTION

1. Field of the Invention

The present invention relates generally to non-volatile magnetic memory and/or spintronic devices and particularly to magnetic random access memory (MRAM).

2. Description of the Prior Art

Computers conventionally use rotating magnetic media, such as hard disk drives (HDDs), for data storage. Though widely used and commonly accepted, such media suffer from a variety of deficiencies, such as access latency, higher power dissipation, large physical size and inability to withstand any physical shock. Thus, there is a need for a new type of storage device devoid of such drawbacks.

Other dominant storage devices are dynamic random access memory (DRAM) and static RAM (SRAM) which are volatile and very costly but have fast random read/write access time. Solid state storage, such as solid-state-nonvolatile-memory (SSNVM) devices having memory structures made of NOR/NAND-based Flash memory, providing fast access time, increased input/output (IOP) speed, decreased power dissipation and physical size and increased reliability but at a higher cost which tends to be generally multiple times higher than hard disk drives (HDDs).

Although NAND-based flash (or non-volatile) memory is more costly than HDD's, it has replaced magnetic hard drives in many applications such as digital cameras, MP3-players, cell phones, and hand held multimedia devices due, at least in part, to its characteristic of being able to retain data even when power is disconnected. However, as memory dimension requirements are dictating decreased sizes, scalability is becoming an issue because the designs of NAND-based Flash memory and DRAM memory are becoming difficult to scale with smaller dimensions. For example, NAND-based flash memory has issues related to capacitive coupling, few electrons/bit, poor error-rate performance and reduced reliability due to decreased read-write endurance. Read-write endurance refers to the number of reading, writing and erase cycles before the memory starts to degrade in performance due primarily to the high voltages required in the program, erase cycles.

It is believed that NAND flash, especially multi-bit designs thereof, would be extremely difficult to scale below 45 nanometers. Likewise, DRAM has issues related to scaling of the trench capacitors leading to very complex designs which are becoming increasingly difficult to manufacture, leading to higher cost.

Currently, applications commonly employ combinations of EEPROM/NOR, NAND, HDD, and DRAM as a part of the memory in a system design. Design of different memory technology in a product adds to design complexity, time to market and increased costs. For example, in hand-held multimedia applications incorporating various memory technologies, such as NAND Flash, DRAM and EEPROM/NOR flash memory, complexity of design is increased as are manufacturing costs and time to market. Another disadvantage is the increase in size of a device that incorporates all of these types of memories therein.

There has been an extensive effort in development of alternative technologies such as Ovanic Ram(or phase-change memory), Ferromagnetic Ram(FeRAM), Magnetic Random Access Memory (MRAM), Nanochip, and others to replace memories used in current designs such as DRAM, SRAM, EEPROM/NOR flash, NAND flash and HDD in one form or another. Although these various memory/storage technologies have created many challenges, there have been advances made in this field in recent years. MRAM seems to lead the way in terms of its progress in the past few years to replace all types of memories in the system as a universal memory solution.

High density magnetic random access memory (MRAM) has the potential to be the next generation storage device because of its unique advantages, such as non-volatility, i.e. preserving its stored values even when it is not receiving power, radiation hardness, high density, fast speed, and the like. MRAMs may be driven by magnetic field or by spin current. The latter has been known to attract a lot of attention due to its simplified design, reliability, and less cross talk. However, both of these MRAMs, i.e. spin current driven and magnetic field driven, will soon meet their writing power limitation with the memory cell size shrinking Since a typical memory cell dimension of a memory cell made of MRAM is less than 100 nanometers (nm) for high density MRAM design, a high shape anisotropy or high magnetocrystalline anisotropy (Ku) material need be used in order to keep a relatively high Ku*V (or KuV) to resist thermal fluctuation, which acts to destroy the stored data. Therefore, the writing power (either through magnetic field or spin current, which highly depends on anisotropy energy constant Ku), has to be greatly increased to overcome the energy barrier between the two stable states. Such high writing power causes problems, particularly in MRAM memory elements having in-plane magnetic anisotropy, i.e. the magnetic moment of the free and fixed layers are parallel to the easy axis. Such problems include as poor compatibility with other electronic devices, high power consumption, and cross talk. However, unless the aspect ratio of a memory element made of the foregoing MRAM is large, thermal instability results. A high aspect ration is clearly undesirable because among other reasons, it prevents scalability and high density memory. Thermal instability is clearly undesirable because it causes unreliable memory.

Thus, there is a need for MRAM with spin current driven type switching (or spin torque transfer effect) with a relatively low switching current density and perpendicular magnetocrystalline anisotropy.

SUMMARY OF THE INVENTION

To overcome the limitations in the prior art described above, and to overcome other limitations that will become apparent upon reading and understanding the present specification, the present invention discloses a method and a corresponding structure for a magnetic storage memory device that is based on current-induced-magnetization-switching having reduced switching current in the magnetic memory.

Briefly, an embodiment of the present invention includes a memory element having a composite (or hybrid) free layer including a first free sub-layer formed on top of the bottom electrode, a nano-current-channel (NCC) layer formed on top of the first free sub-layer, and a second free sub-layer formed on top of the NCC layer, wherein when switching current is applied to the memory element, in a direction that is substantially perpendicular to the layers of the memory element, local magnetic moments of the NCC layer switch the state of the memory element.

These and other objects and advantages of the present invention will no doubt become apparent to those skilled in the art after having read the following detailed description of the preferred embodiments illustrated in the several figures of the drawing.

IN THE DRAWINGS

Figure 4A:
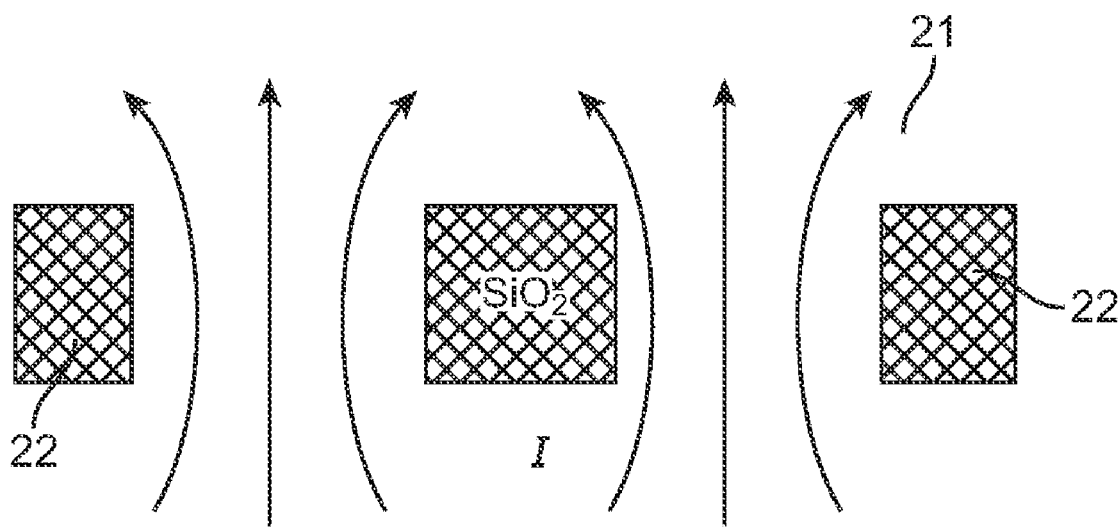
FIG. 4(a) shows the current confined effect of the layer 16 with longitudinal (in-the film plane) magnetic anisotropy.
Figure 4B:
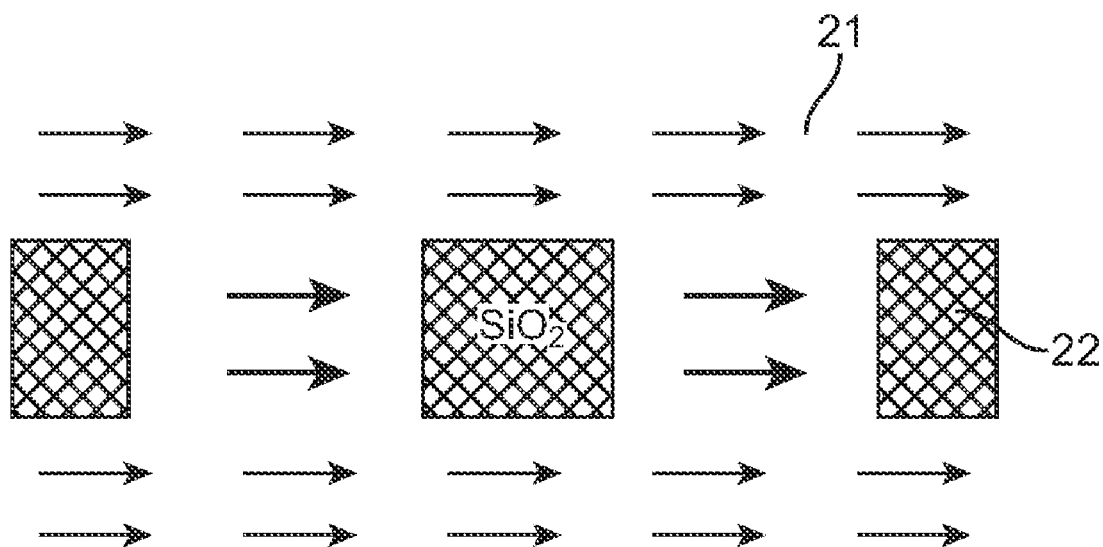

FIG. 4(b) shows the spin configurations (of the memory element 10), with longitudinal anisotropy, as a result of the coupling between the layers 14 and 18 through the magnetic nano-channels of the layer 20.

Figure 5A:
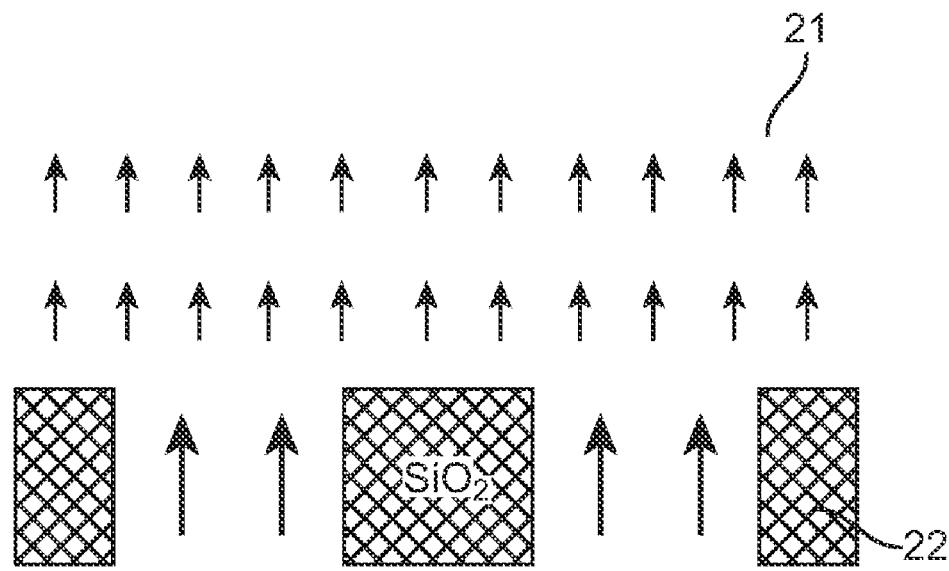

FIG. 5(a) shows the spin configurations in the layer 16 with perpendicular anisotropy (out-of-film plane or perpendicular to the film plane) and remnant status.

Figure 5B:
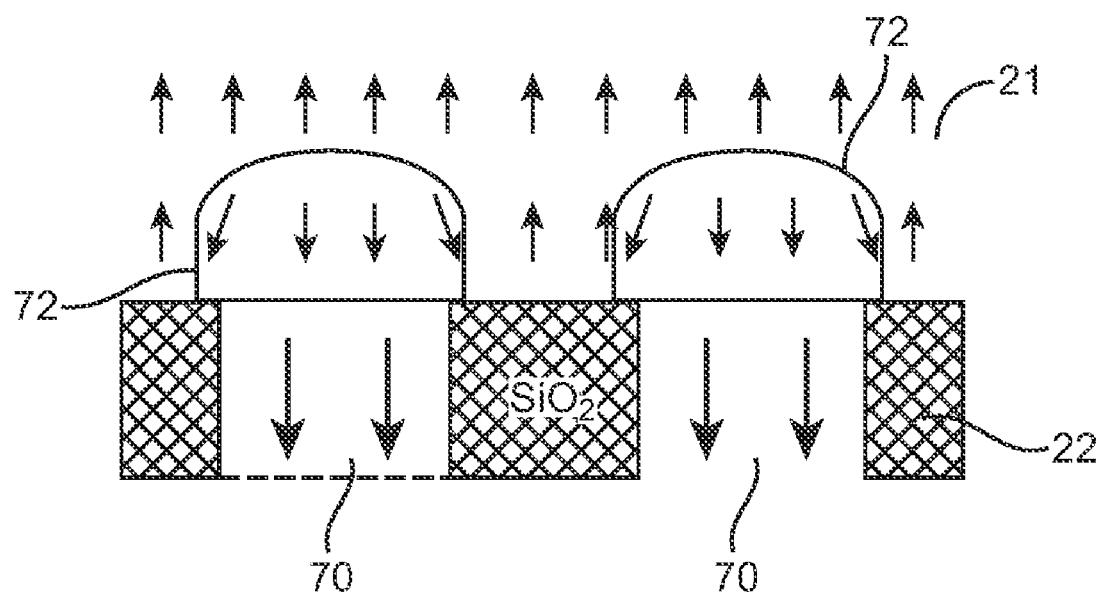

FIG. 5(b) shows the spin configurations in the layer 16 with perpendicular anisotropy and localized spin switching (domain nucleation) with a reverse current or field.

Figure 6A:
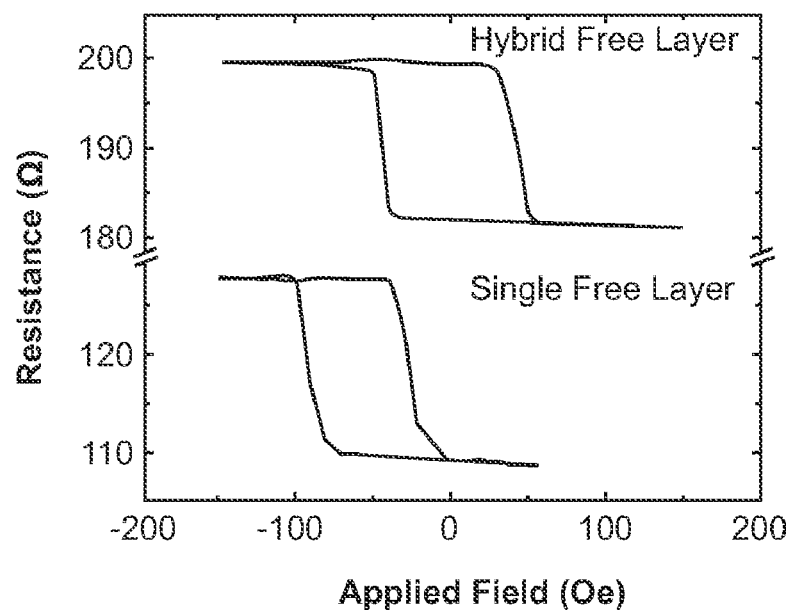

FIG. 6(a) shows a graph of the magnetic field effect (or hysteresis effect) (magnetic field in the x-axis and resistance in the y-axis) of a memory element including the layer 16 and having longitudinal anisotropy and a memory element without the layer 16 (a single free layer) and having longitudinal anisotropy.

Figure 6B:
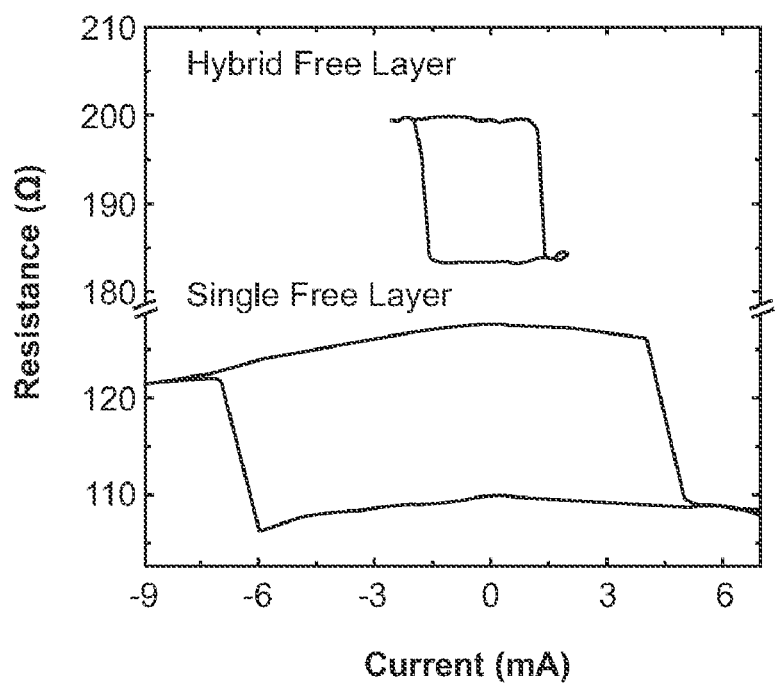

FIG. 6(b) shows a graph of the spin transfer curves (switching current (in the x-axis) vs. resistance (in the y-axis)) for a memory element including the layer 16 and having longitudinal anisotropy and a memory element without the layer 16 (or a single free layer) and having longitudinal anisotropy.

Figure 7A:
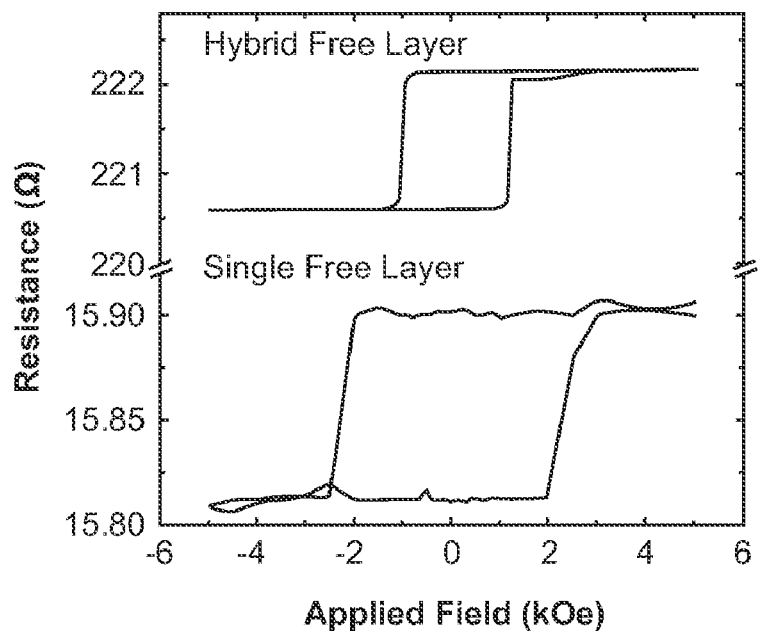

FIG. 7(a) shows a graph of the magnetic field effect (or hysteresis effect) (magnetic field in the x-axis and resistance in the y-axis) of a memory element including the layer 16 and having perpendicular anisotropy and a memory element without the layer 16 (a single free layer) and having perpendicular anisotropy.

Figure 7B:
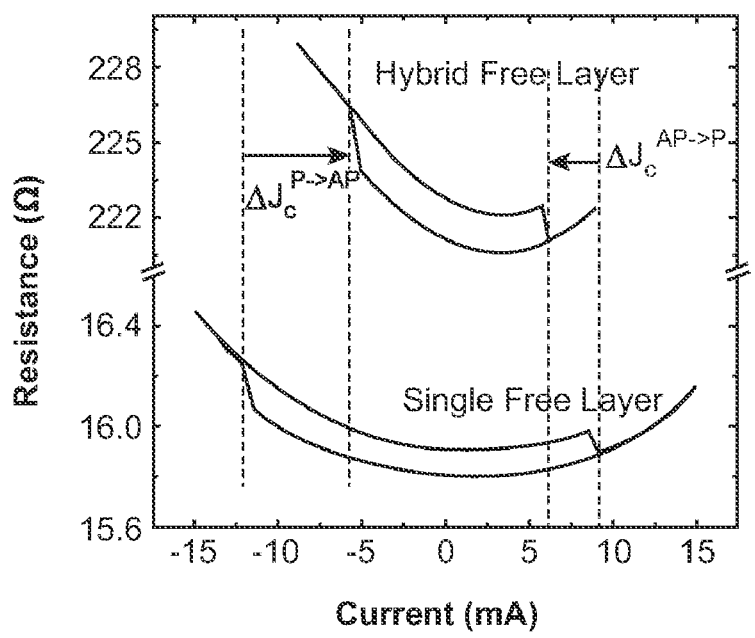

FIG. 7(b) shows a graph of the spin transfer curves (switching current (in the x-axis) vs. resistance (in the y-axis)) for a memory element including the layer 16 and having perpendicular anisotropy and a memory element without the layer 16 (or a single free layer) and having perpendicular anisotropy.

DETAILED DESCRIPTION OF THE PREFERRED EMBODIMENT

In the following description of the embodiments, reference is made to the accompanying drawings that form a part hereof, and in which is shown by way of illustration of the specific embodiments in which the invention may be practiced. It is to be understood that other embodiments may be utilized because structural changes may be made without departing from the scope of the present invention.

In an embodiment of the present invention, a Magnetic Random Access Memory (MRAM) element of a spin current driven type of switching (or spin torque transfer effect) with a relatively low switching current density includes a composite (or hybrid) free layer, included in the layers of MRAM element. The composite free layer has a nanocurrent-channel (NCC) layer sandwiched by two free sub-layers and having a fixed layer, wherein both the free layer separated from the composite free layer by a spacer layer, the fixed layer and the composite free layer have a perpendicular magnocrystalline anisotropy, i.e. their magnetic moment is perpendicular to the film plane wherein the film plane is the surface of a wafer onto which MRAMs are built.

Alternatively, the magnetic moments of the fixed layer and the composite free layer are longitudinal (or the fixed layer and the composite free layer have a longitudinal magnocrystalline anisotropy), i.e. their magnetic moment is longitudinal (or parallel) to the film plane wherein the film plane is the surface of a wafer onto which MRAMs are built. As will be discussed with reference to the figures below, a memory element 10 includes a composite free layer 16 and a fixed layer 26.

Yet alternatively, any one of the composite free layer or the fixed layer has magnetic moments that are longitudinal or perpendicular.

The magnetic easy axis direction of free layer and fixed layer can be tilted away from the in-plane and perpendicular direction too.

Figure 1:
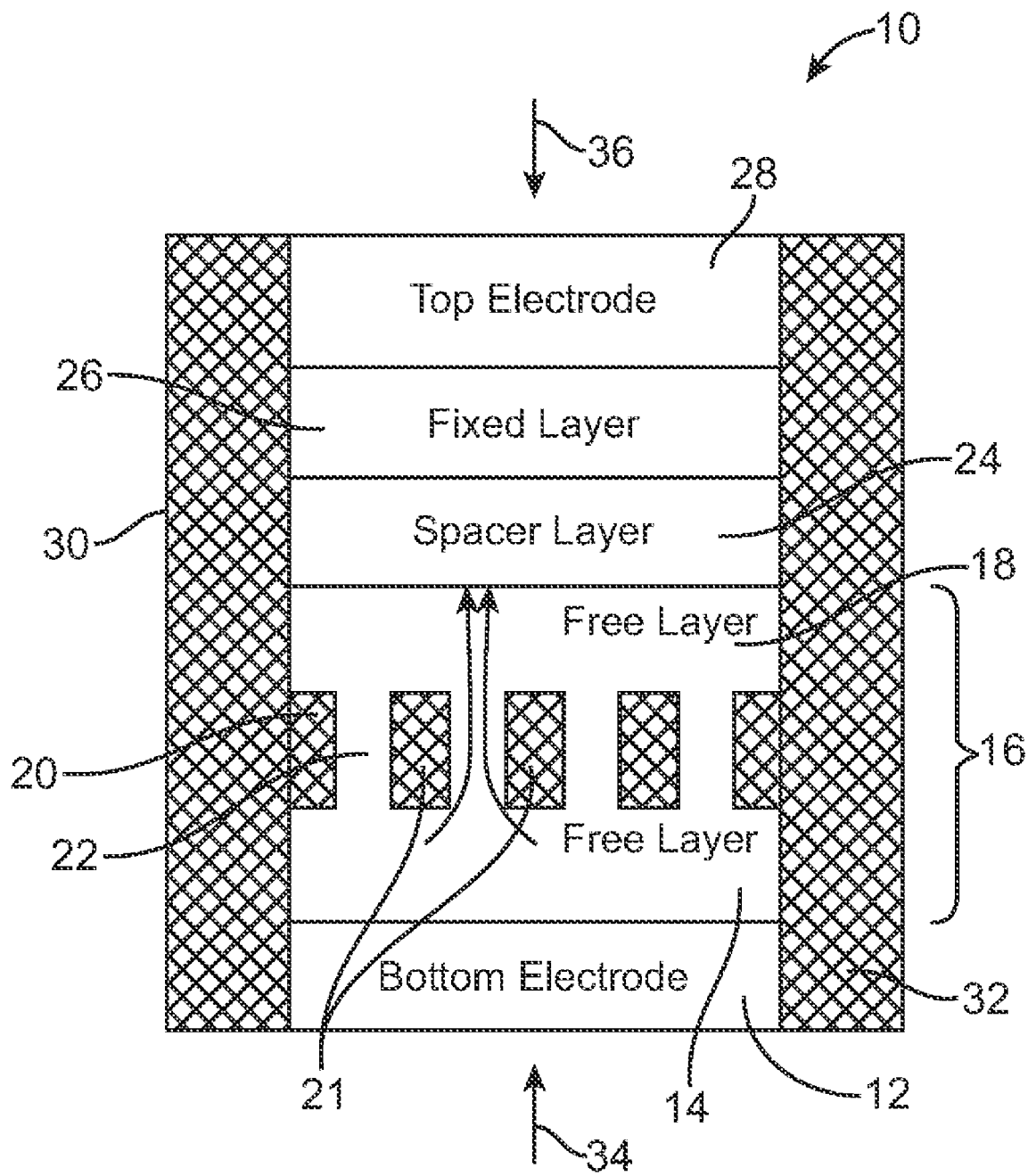
FIG. 1 shows a two dimensional side view of a memory element, in accordance with an embodiment of the present invention.

Referring now to FIG. 1, a two-dimensional view of relevant layers of an MRAM element 10 is shown in accordance with an embodiment of the present invention. The memory element 10 is shown to include a bottom electrode 12, known to be formed on top of a substrate (not shown), on top of which is shown formed a composite (or hybrid) free layer 16, on top of which is shown formed a spacer layer 24, on top of which is shown formed a fixed layer 26 on top of which is shown formed a top electrode 28. At either side of the layers 12, 16, 24, 26 and 28 is shown formed insulation (non-conductive) layers 30 and 32. The layer 16 is shown formed of three layers, a free sub-layer 14, formed on top of the bottom electrode 12, a nano-current-channel (NCC) layer 20 formed on top of the sub-layer 14 and a free sub-layer 18 shown formed on top of the NCC layer 20.

In one embodiment of the present invention, the top and bottom electrodes 28 and 12, are each made of copper (Cu) or aluminum (Al) and their multilayer structures although other similar material is anticipated.

In FIG. 1, the layers 16, 24 and 26 collectively comprise a magnetic tunnel junction (MTJ).

In operation, current is applied at 34 to the bottom electrode 12 and therethrough the layers of the memory element 10, through the top electrode 28. Alternatively, current is applied to the top electrode 28 through the layers of the element 10 down to the bottom electrode 12.

The NCC layer 20 is a composite layer made of magnetic grains (or magnetic nano-channels) and non-magnetic material (and insulating) matrix. More specifically, the layer 20 is made of magnetic grains 21, appearing as rectangles in shape, from the view in FIG. 1, dispersed horizontally through the layer 20 and further made of non-magnetic matrix 22. The shape of the grains 21 may be other than rectangular and more conveniently made more circular. The matrix 22 fills in the spaces between the grains 21 with non-magnetic (non-conductive) material.

The layers 14 and 18 are generally made of magnetic material. In an exemplary embodiment, the layers 14 and 18 are each made of alloys having a ferromagnetic primary element, such as cobolt iron (CoFe), iron (Fe), iron nickel (FeNi), iron cobolt nickel (FeCoNi), iron plantinum (FePt), such as, but not limited to, $Fe_3Pt$, cobolt plantinum (CoPt), such as, but not limited to, $Co_3Pt$, or multi-layers of cobolt and palladium $[Co/Pd]_n$ or cobolt nickel $[Co/Ni]_n$. In some embodiments, additionally, further elements are used in combination with any of the foregoing elements for doping and making fine microstructure such as any one of the following elements: Boron (B), nitrogen (N), carbon (C), silicon (Si) or any other element that has low solubility in the foregoing elements.

The grains 21 are generally made of a conducting material having high spin polarization ratio and being magnetically soft and the matrix 22 is generally made of an insulating material easily grown to form substantially a cylindrical or columnar shape to have lower extra resistance. That is, the hybrid free layer adds resistance to the memory element. Even in the presence of such extra resistance, the magnetic field remains substantially the same as that of a memory element without a hybrid free layer. A graph of showing the magnetic field effects with and without the hybrid free layer is presented herein.

In an exemplary embodiment, the layer 20 may be made of magnesium oxide (MgO), silicon dioxide ($SiO_2$), titanium dioxide ($TiO_2$), alumina ($Al_2O_3$), or any other insulating material.

The layer 24, which is interchangeably referred to as the barrier layer or tunneling layer is made of magnesium oxide (MgO) and may contain a thin layer of magnesium (Mg) to ensure minimal damage to the underlying free layer during the time MgO is deposited, and also to ensure more perfect crystalline growth of the MgO layer. The barrier layer 24 is alternatively made of aluminum oxide ($Al_2O_3$), titanium dioxide ($TiO_2$), germanium (Ge) or other similar insulating material.

It is noted that in some embodiments, the memory element 10 is flipped so that the top electrode is positioned where the bottom electrode appears in FIG. 1 and the fixed layer 26 is formed on top of the top electrode on top of which is formed the layers 18, 20 and 14.

The top and bottom electrodes 28 and 12, respectively, are each made of a conductive material, such as but not limited to copper (Cu) or aluminum (Al). The layer 26 is made of cobolt iron (CoFe), iron (Fe), iron nickel (FeNi), iron cobolt nickel (FeCoNi), iron plantinum (FePt), such as, but not limited to, $Fe_3Pt$, cobolt plantinum (CoPt), such as, but not limited to, $Co_3Pt$, or multi-layers of cobolt and palladium $[Co/Pd]_n$ or cobolt nickel $[Co/Ni]_n$. In some embodiments, additionally, further elements are used in combination with any of the foregoing elements for doping and making fine microstructure such as any one of the following elements: Boron (B), nitrogen (N), carbon (C), silicon (Si) or any other element that has low solubility in the foregoing elements.

In an exemplary embodiment, the layers 30 and 32 are each made of silicon dioxide ($SiO_2$), however, other types of insulating material is anticipated. In practical applications, during deposition, the layers 30 and 32 are made of and are the same layers.

In an exemplary embodiment, the thicknesses of each of the layers of the memory element 10 are as follows: The bottom electrode 12 is typically less than 100 nanometers (nm) the sub-layer 14 is typically less than 10 nm, the layer 20 is typically less than 10 nm, the sub-layer 18 is typically less than 10 nm the layer 24 is typically less than 5 nm, the layer 26 is typically less than 10 nm, the top electrode 28 is typically less than 100 nm, and the layers 30 and 32 are the layers encapsulating the memory element and separating it from neighboring memory elements, thus, being variable in thickness, as dictated by the manufacturing process.

In an embodiment of the present invention, the memory element 10 is a spin transfer device that has two magnetoresistance states that can be switched from one state to another by directly applying a current from the top to the bottom electrode or from the bottom to the top electrode. The magnetoresistance states refer to the magnetization configuration between the free layer (combination of layers 14 and 18 and 20) and fixed layer 26, in parallel or anti-parallel.

In another embodiment of the present invention, the memory element 10 is a magnetic field switching device for which the magnetic field is generated by the current being applied to lower the switching field.

Figure 2:
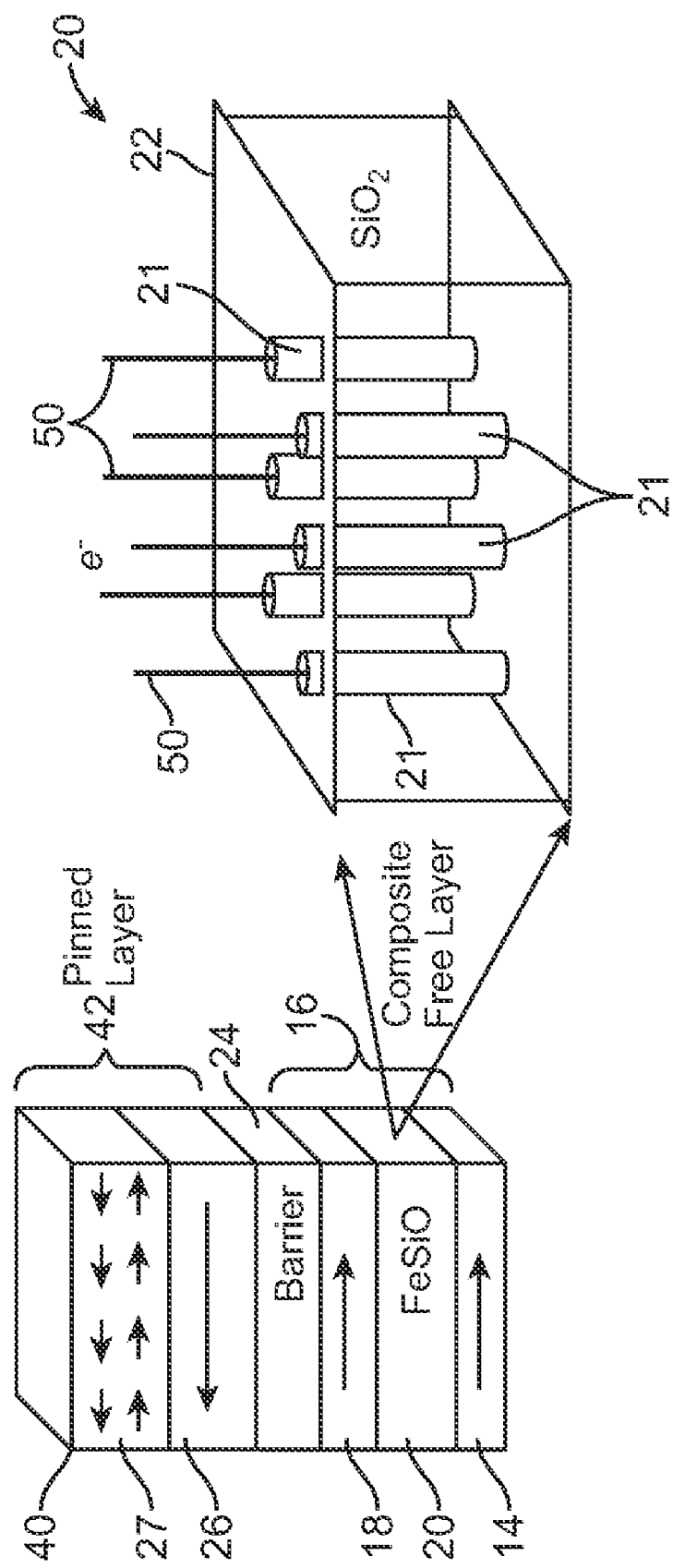
FIG. 2 shows a three dimensional side view of further details of the memory element, in accordance with an embodiment of the present invention.

The memory element 10 is a spin transfer type of device with advantageously lower switching current density in accordance with one embodiment of the present invention. In an exemplary embodiment, the spin current driven type switching (spin torque transfer effect) in the foregoing MTJ structure (including the hybrid free layer), has a relatively low switching current density. The hybrid free layer 16 has a nano-current-channel (NCC) FeSiO layer (or layer 20 in FIG. 1), sandwiched by two CoFe layers (or layers 14 and 18). The NCC layer has magnetic and conducting Fe(Si) grains (or magnetic grains 21) in columnar shape and $SiO_2$ insulator matrix as shown in FIG. 2.

Fe(Si) grains are magnetically coupled with the two CoFe layers. The spin current passes substantially only through the conducting grains (or magnetic grains 21) in the NCC layer (or layer 20) of the memory element 10. This results in high current density in these conducting magnetic grains and thus induces their magnetization switching. Thermal fluctuation caused by local high current density may also contribute to the magnetization switching in these Fe(Si) grains. Because of the existence of the reverse magnetized grains and their coupling to the CoFe layers, the magnetization switching of CoFe layers is easier. The thermal stability factors represented by the equation:

$$\left(\frac{K_u V}{k_B T}\right) \quad \text{Equation (1)}$$

(wherein Ku represents magnetic anisotropy, V represents the volume of switching unit, the Boltzman constant and T represents temperature) and intrinsic switching current density are known to be affected in the following manner in the presence of the NCC layer. The switching current density is reduced while no impact is realized as to the thermal stability factor. The thermal stability of the composite free layer (or layer 16) at remnant status (zero field or zero current) or reading status (with low sensing current) is determined by the total volume of CoFe layers (or layers 14 and 18) (exchange coupled through Fe(Si) grains) and not degraded by the inserted NCC layer 20. Therefore, the composite free layer structure of the memory element 10 not only reduces the writing power but also keeps a relatively high thermal stability, which provides a practical approach to address the dilemma of the high recording density (small free layer volume, thermal instability) and the high writing power (high $K_u$ materials).

The film plane in FIG. 1 is shown to be in a direction into the plane of the page. In the case where magnetic anisotropy is longitudinal, the magnetic moments are in a direction parallel to the film plane and in the case where the magnetic anisotropy is perpendicular, the magnetic moments are in a direction perpendicular to the film plane.

While discussions in this document are directed to perpendicular magnetic anisotropy by the memory element 10, it is understood that the longitudinal magnetic anisotropy is anticipated. The magnet anisotropy of the composite free layer 16 is magnetocrystalline anisotropy, interface anisotropy or shape anisotropy.

In the case where the memory element has an in-plane or longitudinal magnetic anisotropy, an off-angle, oblique, glancing-angle thin-film deposition (sputtering, evaporation, ion beam deposition, laser beam deposition, or the like), or ion-beam assisted deposition is used to produce in-plane texture for the in-plane magnetocrystalline anisotropy.

In the case of perpendicular anisotropy, perpendicular anisotropy is generated by the magnetocrystalline anisotropy and/or interface anisotropy. The materials used for the composite free layer 16 in this case are chemically ordered L10 phase FePt, CoPt, chemically ordered bct-structured FeCo or ordered Fe16N2, [Co/Pt]n or [Co/Pd]n (n being an integer) or any other superlattice structure.

The magnetization of composite free layer 16 and the fixed layer 26 are perpendicular or out-of-film plane, in accordance with one embodiment of the present invention. In some embodiments, both the composite free layer 16 and the fixed layer 26 or any one of the composite free layer 16 or fixed layer 26 has perpendicular anisotropy, i.e. the magnetic easy axis direction is out of film plane (perpendicular to the film plane). The origin of the perpendicular anisotropy can be from magnetocrystalline anisotropy or shape anisotropy. Exemplary materials with magnetocrystalline anisotropy are FePt, CoPt, Fe16N2, FePtNi, CoPtNi, Fe/Pt multilayer, Co/Pd multilayer, Co/Ni multilayer and the above alloy or compounds with the third or forth element to refine the structure and properties. The origin of the shape anistropy can be from the shape of the fixed layer and/or free layer, in which the film thickness (out of film plane) is larger than the device lateral dimension (in film plane).

Examples of applications of a structure including the composite free layer 16, other than MRAM, includes, but is not limited to spin torque oscillators, spin logic devices, and others.

FIG. 2 shows a three dimensional side view of further details of the memory element 10, in accordance with an embodiment of the present invention. The structure of FIG. 2 is shown to form a magnetic tunnel junction (MTJ) formed of a pinned layer 42, the barrier layer 24 and the free layer 16. The barrier layer 16 is shown formed on top of the free layer 16 and the pinned layer 42 is shown formed on top of the barrier layer 24. The pinned layer 42 is shown formed of a pinning layer 27, which is formed between the fixed layer 26 and the top electrode 28 (of FIG. 1) and the layer 26 is shown to have a magnetic moment antiparallel (AP) to the magnetic moments of the sub-layers 14 and 18. The pinning layer 27 is used to fix the magnetic moment of the layer 26. The magnetic moments of the layers 26, 18 and 14 are each shown to be in a direction shown by the direction of the arrow of their respective layer.

It should be appreciated that while the structure of the memory element 10 is described as including an MTJ, in other embodiments, other than an MTJ is employed, such as gian magnetoresistance (GMR) and magnetic diode and other magnetic structures.

In an exemplary embodiment, the pinning layer 27 is made of iridium manganese (IrMn), Platinum manganese (PtMn), or nickel manganese (NiMn). and is typically less than 200 nm in thickness.

An exploded view of the layer 20 is shown on the right side of the FIG. 2 where the grains 21 are shown to each be generally cylindrical in shape with spaces in between shown filled in by $SiO_2$. The grains 21 are generally made of magnetic material, whereas the matrix 22 is made generally of non-magnetic material. When current is applied at 34 (in FIG. 1), electrons flow into the grains 21 in a direction indicated by the direction of the arrows 50 and the spin current passes substantially only through the conducting grains (or magnetic grains 21) in the NCC layer (or layer 20) of the memory element 10. This results in high current density in these conducting magnetic grains and thus induces their magnetization switching. Thermal fluctuation caused by local high current density may also contribute to the magnetization switching in these Fe(Si) grains. Because of the existence of the reverse magnetized grains and their coupling to the CoFe layers, the magnetization switching of CoFe layers is easier.

The layer 20 is a composite free layer or granular free layer, generally made from FeSiO, in an exemplary embodiment, wherein the grains 21 are made of Fe(Si) and the matrix 22 is made of $SiO_2$. The matrix 22 is not limited to an oxide-based material and can be made of other types of insulating material.

The effect of the nano-current-channel of the layer 20 confines the current perpendicularly passing through the element 10, as shown by the direction of the arrows through the layer 16 and increases the local current density to make spin transfer switching easier. Current is confined to travel only through the spaces between the grains 21, or confined current-channel, in the layer 20, which causes lower switching current density.

Switching of the magnetic moment of the free layer 16 from one state to another, such as from parallel relative to the pinned layer 42 to anti-parallel relative to the pinned layer 42, thereby storing a bit state, i.e. '1' or '0', in the element 10. The magnetic moment of each of the grains 21 switches locally, or within the grain, thereby reducing the switching field of the other magnetic layers, such as the sub-layers 14 and 18, which are exchange coupled to the grains 21. This type of exchange coupling effect is desirable because the switching current required to switch the state of the memory element 10 is reduced, by as much as 75% or more as shown below while the aspect ratio of the grains 21 is also lower such as less than 3 or in some cases less than 1. The increased local current density increases the temperature of the grains 21 thus reducing the switching field or current density of the grains 21.

In one embodiment, the current density is reduced by more than 75% although in an optimized memory element structure (by varying the process conditions for depositing the NCC layer and/or thicknesses and/or compositions thereof), the current density may be reduced to one tenth of that which it is currently.

In an exemplary embodiment, the grains 21 are made of Fe, FeSi, FeCo, FeN, FeCoB, FeCoNi, Co, CoPt, or Co alloy. The matrix 22 is made of material such as but not limited to $SiO2$, SiOx, $Al_2O_3$, $TiO_2$, HfO, TaO, ZrO, CoO, or FeO. The ratio of the magnetic conducting region and the insulating region, in the layer 20, in an exemplary embodiment of the present invention, is as follows. The SiO₂ boundary dimension is approximately 2-3 nm and the diameter of the FeSi grains is approximately 5 nm.

An exemplary structure of the MTJ 40 having a perpendicular anisotropy with a composite free layer is bottom electrode/FePt/FeCo—SiO2/FePt/FeCoB/MgO/FeCoB/FePt/CrRu/top electrode, wherein the FePt, formed on top of the bottom electrode and the FePt formed on top of the NCC layer made FeCo—SiO2, are the sub-layers of the composite free layer. The perpendicular magnetized FePt layer is L10 chemically ordered or partially chemically ordered for high anisotropy and is replaced by a perpendicular magnetized layer with bet-structured FeCo, ordered Fe16N2, L10 phase CoPt, FeCoPt, [Co/Ni]n, [Co/Pt]n, or [Co/Pd]n.

FeCo in the case where the grains 21 are made therefrom in a FeCo—SiO2 NCC layer, are coupled to the bottom and top FePt layers (or sub-layers of the free layer), FeCo—SiO2 (magnetic NCC layers) are made of Co—SiO2, FeCo—TiO2, FeN—TiO2, FeCo—HfO, or FeCo—TaO. The MgO may be replaced with other barrier materials such as AlO, CrO2 or other single crystalline structure materials. MgO may also be replaced with Cu, Au in the case where the memory element 10 has a giant magnetoresistnace structure rather than having an MTJ. Optionally, a seed layer made of CrRu is formed on top of the bottom electrode 12 for building (002) texture. Other material used to form the seed layer are rhodium aluminum (RuAl), TiN, CrW, CrX (X being either tungsten (W), aluminum (Al) or the like). A (001) crystalline structured MgO layer may be optionally formed under a seed layer, the seed layer formed generally on top of the bottom electrode. This will result in high magnetoresistance. Optionally, a (002) textured underlayer formed between the bottom electrode and the seed layer further increases the magnetoresistance.

A typical configuration of a memory element, such as the memory element 10, with an underlayer, seed layer and remaining layers is made of the following: Bottom electrode/FePt/FeCo—SiO2/FePt/FeCoB/MgO/FeCoB//FePt/CrRu/top electrode.

In the case where longitudinal anisotropy is used instead of perpendicular anisotropy, in combination with the NCC layer, while higher densities of memory cells made of such a memory element is achieved, the switching current is nevertheless undesirably high. However, the combination of the composite free layer including an NCC layer and perpendicular anisotropy advantageously reduces switching current density while maintaining high density and therefore scalability of memory cells made of such memory element structures. This is in large part due to current being directed through the channels (or grains 21) and not around the channels in the composite free layer.

Figure 3:
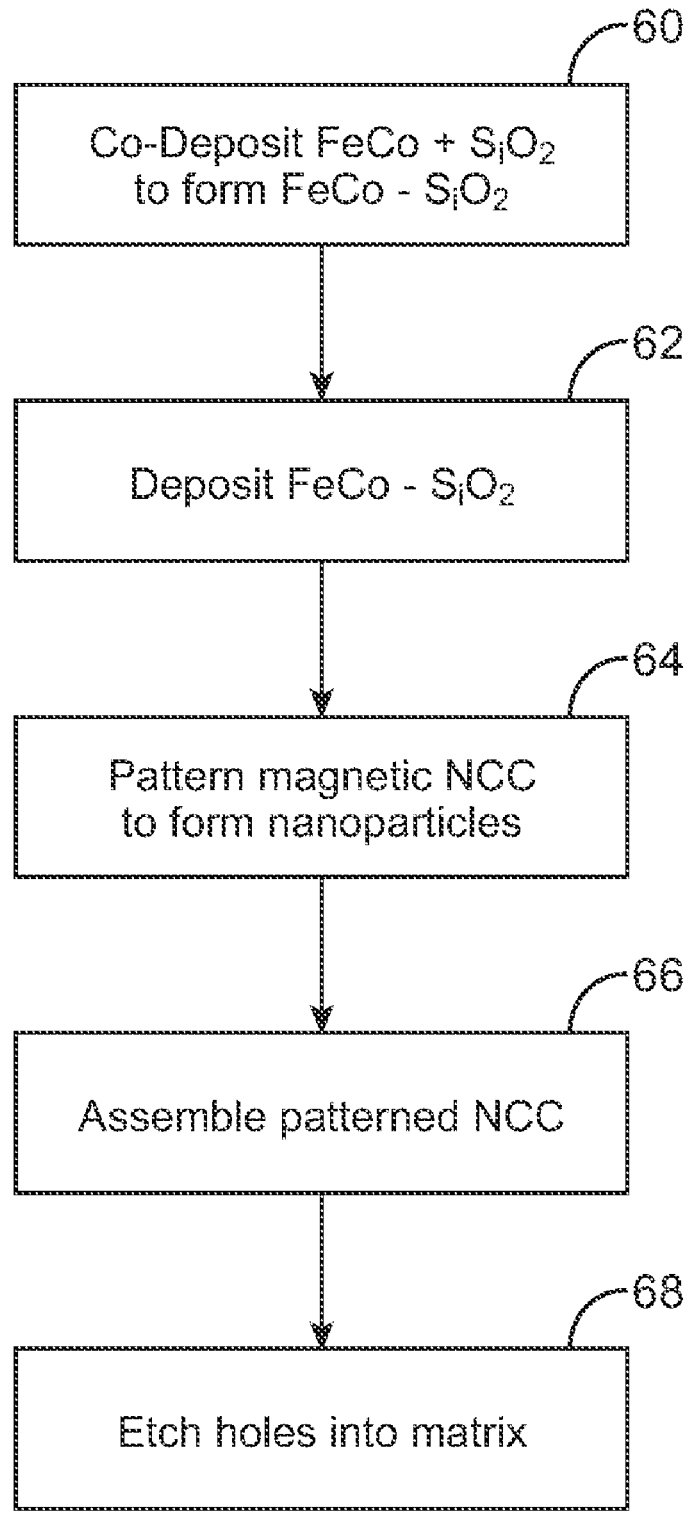
FIG. 3 shows an exemplary method of manufacturing the NCC layer of the memory element, in accordance with a method of the present invention.

An exemplary method of manufacturing the layer 20 is shown in FIG. 3, in accordance with a method of the present invention. In FIG. 3, at step 60, FeCo and SiO2 are co-deposited to form FeCo—SiO2, using any of the following methods: Sputtering, evaporating, laser-depositing, chemical vapor depositing, ion beam depositing or any other such techniques.

Next, at step 62, the co-deposited FeCo—SiO2 is deposited using a composite FeCo—Sio2 source and using methods such as sputtering, evaporating, laser-depositing, chemical vapor depositing or ion beam depositing. Next, at step 64, magnetic NCC is patterned to form magnetic nanoparticles (or grains 21) using electron beam writer and/or phase shift mask lithography processes, well known in the industry. Next, at step 66, the patterned nanoparticles are assembled into insulating matrix (or the matrix 22). Next, at step 68, holes are etched into the insulating matrix by nano-patterning mask (nanoparticle arrays) and filling the holes with a magnetic material, such as FeCo.

The layer 20 can be made by lithography process (either electron beam or phase-shift-mask lithography process) with magnetic or non-magnetic conducting channels and insulating matrix. In this fabrication method, the area ratio of conducting channels over the whole device is substantially smaller, such as reduced to 20% or even 10%. In an extreme case, solely one small channel is made in the layer 20.

In one application of the memory element 10, the memory element 10 is integrated with semiconductor and/or magnetic semiconductor devices such as diodes or transistors to form a plurality of memory cells to which information or data is written and/or read therefrom.

In another application, the memory element 10 is used in a magnetic random access memory cell for information storage. The composite free layer or layer 16 includes the sub-layers and grains 21 discussed and shown herein, where the grains 21 have low switching field and function as the storage layer with magnetization switching from one direction to another. The composite free layer can be perpendicular or longitudinally magnetized.

In yet another application of the memory element 10, it is integrated with magnetic nanowires and nanotubes.

In still another application, the memory element is used for spin torque transfer random access memory cell (SpinRAM). The composite free layer, or layer 16, includes the sub-layers discussed herein and the NCC layer discussed herein wherein the latter, or layer 20, functions as the storage layer with magnetization switching from one state, such as binary value '1', to another state, such as binary value '0', or vice versa. Alternatively, a memory cell made of the memory element 10 stores more than two states because it includes multiple MTJs. This multilevel or multistage storage device is realized by selectively controlling the magnetic NCCs designed with different switching fields by for example, applying different levels of switching current to cause switching of multiple states.

In still another application, an appropriate controllable current is passed through a device made from the memory element 10 and though its composite free layer, and such a device is used for generating microwave with high power efficiency and or power. An array of such devices is made from generating microwave for purpose other than storage, such as communications systems. Still alternatively, the memory element 10 is used for generating high efficient spin waves for communication devices. Still alternatively, the memory element 10 is used for magnetic logic devices, spin transistors and magnetic processors.

FIG. 4(*a*) shows the current confined effect of the layer 16 with longitudinal anisotropy. As shown in FIG. 4(*a*), current is substantially confined to traveling in a direction consistent with the direction of the arrows and through the layer 21, avoiding the layer 22.

FIG. 4(*b*) shows the spin configurations (of the memory element 10), with longitudinal anisotropy, as a result of the coupling between the layers 14 and 18 through the magnetic nano-channels of the layer 20. The spin configuration, in FIG. 4(*b*) is shown in a direction consistent with the direction to which the arrows point and substantially all parallel with the plane of the page.

FIG. 5(*a*) shows the spin configurations in the layer 16 with perpendicular anisotropy and remnant status. As shown in FIG. 5(*a*), current is substantially confined to traveling in a direction consistent with the direction of the arrows (or vertically) and through the layer 21, avoiding the layer 22.

FIG. 5(b) shows the spin configurations in the layer 16 with perpendicular anisotropy and localized spin switching (domain nucleation) with a reverse current or magnetic field. That is, the reverse current is shown at 70 and it is in a direction opposite to the direction of the current through the layer 21. The localized spin switching is shown at 72 causes an increased current density as the conduction electrons can not travel through the non-conducting regions such as formed by the oxides regions of the NCC layer.

FIG. 6(a) shows a graph of the magnetic field effect (or hysteresis effect) (magnetic field in the x-axis and resistance in the y-axis) of a memory element including the layer 16 and having longitudinal anisotropy and a memory element without the layer 16 (a single free layer) and having longitudinal anisotropy. The applied magnetic field (in Orsted or Oe) is shown in the x-axis and the resistance of the memory element is shown in ohms in the y-axis. As shown, the magnetic field affect of the memory element with the layer 16 remains advantageously substantially the same as that of a memory element having a single free layer.

FIG. 6(b) shows a graph of the spin transfer curves (switching current (in the x-axis) vs. resistance (in the y-axis)) for a memory element including the layer 16 and having longitudinal anisotropy and a memory element without the layer 16 (or a single free layer) and having longitudinal anisotropy. The switching current (in milliamps or mA) is shown in the x-axis and the resistance of the memory element is shown in ohms in the y-axis. As shown, the switching current of the memory element with the layer 16 is advantageously substantially lower than that of a memory element having a single free layer.

FIG. 7(a) shows a graph of the magnetic field effect (or hysteresis effect) (magnetic field in the x-axis and resistance in the y-axis) of a memory element including the layer 16 and having perpendicular anisotropy and a memory element without the layer 16 (a single free layer) and having perpendicular anisotropy. FIGS. 7(a) and (b) include data for a memory element with a size of 100 nm in diameter, substantially circular and having a structure that is Ta/[CoFe/Pt]n/Cu/free layer.

In FIG. 7(a), the applied magnetic field (in kilo Oe) is shown at the x-axis and the resistance of the memory element is shown in ohms at the y-axis. As shown, the magnetic field affect of the memory element with the layer 16 remains advantageously substantially the same as that of a memory element having a single free layer.

FIG. 7(b) shows a graph of the spin transfer curves (switching current (in the x-axis) vs. resistance (in the y-axis)) for a memory element including the layer 16 and having perpendicular anisotropy and a memory element without the layer 16 (or a single free layer) and having perpendicular anisotropy. The switching current (in milliamps or mA) is shown at the x-axis and the resistance of the memory element is shown in ohms at the y-axis. As shown, the switching current of the memory element with the layer 16 is advantageously substantially lower than that of a memory element having a single free layer.

The memory element 10 is included in MRAM made of such elements and advantageously offers more tolerance to the distribution of the size, shape and magnetic properties of the devices comprising such memory elements. The memory element 10 is less sensitive to the fabrication process which is one of key challenges for MRAM production.

The various embodiments of the present invention include a memory element with the thermal stability thereof remaining substantially unchanged but the switching field or current needed is substantially reduced. This novel layer is not only for spin transfer type device to lower down the switching current density but also for traditional field switching devices for which the field is generated by the current to lower the switching field.

Both perpendicular magnetic anisotropy and longitudinal magnetic anisotropy are applicable for the memory element structure of the embodiments of the present invention. The magnetic anisotropy of the composite free layer, such as the layer 16, can be magnetocrystalline anisotropy, interface anisotropy and shape anisotropy. The off-angle, or oblique or glancing-angle thin-film deposition (sputtering, evaporation, ion beam deposition, laser beam deposition, etc) and/or ion-beam assisted deposition is used to produce the in-plane texture for the in-plane magnetocrystalline anisotropy. Perpendicular anisotropy in the composite layer is generated by the magnetocrystalline anisotropy and/or interface anisotropy. The materials for the perpendicular anisotropy composite free layer are chemically ordered and $L1_0$ phase FePt, CoPt, chemically ordered bct-structured FeCo and ordered $Fe_{16}N_2$, $[Co/Pt]_n$ and $[Co/Pd]_n$ and other superlattice structures serve as examples. The magnetic NCC layer, or layer 20, consists of magnetic grains and insulating matrix. Materials for magnetic grains are made of material such as Fe, FeSi, FeCo, FeN, FeCoB, FeCoNi, Co. Materials for the insulating matrix are made of material such as $SiO_2$, $SiO_x$, $Al_2O_3$, $TiO_2$, HfO, TaO, ZrO, CoO, FeO, etc. The foregoing material are not the only material that can be used, as discussed above.

An example of an MTJ device with a perpendicular composite free layer as the layer 16 is made of Electrode/FePt/FeCo—SiO2/FePt/FeCoB/MgO/FeCoB//FePt/CrRu/Electrode but is not limited thereto. Perpendicular magnetized FePt layer is $L1_0$ chemically ordered or partially chemically ordered for high anisotropy and can be replaced by a perpendicular magnetized layer with bct-structured FeCo, ordered $Fe_{16}N_2$, $L1_0$ phase CoPt, .FeCoPt, |Co/Ni|u, |Co/Pt|u, |Co/Pd|, FeCo grains in FeCo—$SiO_2$ are coupled to bottom and top FePt layers. FeCo—$SiO_2$ (magnetic nano-current-channel layers) can be Co—$SiO_2$, FeCo—$TiO_2$, FeN—$TiO_2$, FeCo—HfO, FeCo—TaO, MgO barrier layer can be replaced by other barriers such as AlO, $CrO_2$ or other single crystalline structure materials. MgO can be replaced by Cu, Au, etc, for a giant magnetoresistance structure. CrRu layer on top of the bottom electrode is, but not limited, for building (002) texture. Other seedlayer such as RuAl, CrW, CrX (X=W, Al, or the like) can be used. (001) textured MgO layer can be formed under CrRu layer. Top and bottom electrodes can be Cu and Al and their multilayer structures.

The materials for the NCC layer (FeCo—SiO2) are not limited to FeCo—Si2. The NCC layer is conducting, with high spin polarization ratio and magnetic soft and the design point for the insulating materials is to form easily the columnar growth in NCC layer to have lower extra resistance. The materials for the perpendicular magnetized layer are not limited to FePt. Other choices are FeN, CoPt, Co alloy, . . . The spintronic structure is not limited to magnetic tunnel junction (MTJ), it can instead be giant magnetoresistance (GMR) and magnetic diode and other future devices. The methods for making the magnetic nano-current-channel layer in the composite free layer are as follows, but not limited thereto:

a. Co-depositing FeCo and $SiO_2$, depositing methods include sputtering, evaporation, laser-deposition, chemical vapor deposition, ion beam deposition b. Depositing FeCo—$SiO_2$ using a composite FeCo—$SiO_2$ source, depositing methods include sputtering, evaporation, laser-deposition, chemical vapor deposition, ion beam deposition c. Patterning the magnetic nano-current-channels by Electron Beam Writer and/or Phase Shift Mask Lithography processes.
d. Assembling the magnetic nanoparticles into insulating matrix.
e. Etching the holes in insulating matrix by nano-patterning mask (nanoparticle arrays) and filling holes by the magnetic materials (FeCo, etc).

$L1_0$ phase FePt and CoPt and/or FeCoPt and/or FeCoNiPt for the composite free layer can be prepared by the following methods but not limited thereto:
 a. Deposit (001) textured $L1_0$.FeCoNiPt film on (002) textured FeCoB/(001) textured MgO/(002) textured FeCoB (002) by using CrRu or other BCC phase (002) textured seedlayer and/or underlayer directly.
 b. $L1_0$ phase (001) AuCu (001) and/or (001)PtMn and/or (001)NiMn can be used for the layer on top of CrRu layer to induce the $L1_0$ phase FePt at low deposition temperature.
 c. The composite layer with FePt layer can he deposited first after the electrode and CrRu or other underlayer such as $L1_0$ phase AuCu.
 d. Sputtering and then with a post-annealing process Body center tetragonal (BCT) phased FeCo layer for the composite free layer can be prepared by the following methods but not limited thereto:
 a. Deposit (002) textured BCT FeCo film on (002) textured body center cubic (bcc) phased FeCoB/(001) textured MgO/(002) textured FeCoB(002) by using CrRu or other BCC phase (002) textured seedlayer and/or underlayer directly.
 b. Sputtering and then with a post-annealing process $Fe_{16}N_2$ ordered film with high magnetization value for the composite free layer can be prepared by the following methods but not limited thereto:
 a. Deposit (002) textured $Fe_{16}N_2$ film on (002) textured body center cubic (bcc) phased FeCoB/(001) textured MgO/(002) textured FeCoB(002) by using CrRu or other BCC phase (002) textured seedlayer and/or underlayer directly.
 b. Sputtering and then with a post-annealing process In some embodiments, the sub-free layer 18, which connects to the barrier layer 24 (in MTJ case) (or the Cu layer (in GMR case)) and the layer 20 are one layer and comprise the layer 20. That is, the sub-free layer that is not connected to the barrier layer 24, for example, the second sub-free layer (or the layer 14) is eliminated. This causes an asymmetric situation for the current induced switching. For the MRAM application, this asymmetric case will be critical to adjust the non-symmetry between the critical switching current from parallel to anti-parallel (referring to free layer magnetization direction) and the critical switching current from anti-parallel to parallel (free layer magnetization direction).

The memory element 10's structure can be integrated with semiconductor and/or magnetic semiconductor devices such diodes or transistors. Other applications include integration with the magnetic nanowires and nanotubes. Others include use as magnetic random access memory cell for information storage. The composite free layer consists of sub free layers and magnetic grains with low switching field and functions as the storage layer with magnetization switching from one direction to another. The composite free layer can be perpendicular and longitudinal magnetized. Yet others include use for spin torque transfer random access memory cell (Spin-RAM). The composite free layer functions as the storage layer with magnetization switching from one status to another status. Multilevel or multistage storage is realized by selectively controlling the magnetic nano-current-channels which can be designed with different switching field. In operation, by passing a proper controllable current through a device made of the memory element 10, the device can be used for generating microwave with high power efficiency and or power. An array of such devices can be made for generating microwave for different purpose such as communication. This structure can be used for generating high efficient spin waves for communication devices and/or for magnetic logic devices, spin transistors and magnetic processors.

Although the present invention has been described in terms of specific embodiments, it is anticipated that alterations and modifications thereof will no doubt become apparent to those skilled in the art. It is therefore intended that the following claims be interpreted as covering all such alterations and modification as fall within the true spirit and scope of the invention.

What is claimed is
1. A method of manufacturing a magnetic memory element comprising:
 depositing a seed layer on top of a bottom electrode;
 depositing a first free sub-layer on top of the seed layer, the seed layer being made of CrRu;
 depositing a nano-current-channel (NCC) layer on top of the first free sub-layer;
 depositing a second free sub-layer on top of the NCC layer, the first free sub-layer, the NCC layer and the second free sub-layer forming a composite free layer, the first and second free sub-layers being made of the same material, grains of a substantially cylindrical shape dispersed throughout the NCC layer and surrounded by a matrix, the composite free layer responsive to a current and when the current is applied to and flows bidirectionally through the layers of the magnetic memory element, the first free sub-layer and the second free sub-layer being exchange coupled to the grains, each of the grains having a magnetic moment and the magnetic moment of each of the grains switching locally and within the grain when switching current flows through the magnetic memory element thereby reducing the switching current, the grains made of a conducting material having high spin polarization ratio and being magnetically soft;
 forming a spacer layer on top of the composite free layer; and
 forming a fixed layer formed on top of the spacer layer on top of which is formed a top electrode,
 wherein when current is applied, in a direction that is substantially perpendicular to the layers of the memory element, local magnetic moments of the NCC layer switch the state of the memory element.

2. The method of manufacturing, as recited in claim 1, wherein the fixed layer and the composite free layer each have perpendicular magnetocrystalline anisotropy.

3. The method of manufacturing, as recited in claim 1, wherein the second free sub-layer is non-nickel based.

4. The method of manufacturing, as recited in claim 1, wherein the top and bottom electrodes are each made of copper (Cu) or aluminum (Al).

5. The method of manufacturing, as recited in claim 1, wherein each of the first and second free sub-layers is made of an alloy selected from a group consisting of: cobolt iron (CoFe), iron (Fe), iron nickel (FeNi), iron cobolt nickel (FeCoNi), iron plantinum (FePt), $Fe_3Pt$, cobolt plantinum (CoPt), $Co_3Pt$, and multi-layers of cobolt and palladium.

6. The method of manufacturing, as recited in claim 5, wherein each of the first and second free sub-layers is further made of a material selected from a group consisting of:

Boron (B), nitrogen (N), carbon (C), and silicon (Si).

7. The method of manufacturing, as recited in claim 1, wherein the grains are made of magnetically soft material.

8. The method of manufacturing, as recited in claim 1, wherein the matrix is made of an insulating material.

9. The method of manufacturing, as recited in claim 1, wherein the grains are made of iron silicon (FeSi).

10. The method of manufacturing, as recited in claim 1, wherein the matrix is made of silicon dioxide ($SiO_2$).

11. The method of manufacturing, as recited in claim 1, wherein the NCC layer is made of a material selected from a group consisting of: magnesim oxide (MgO), silicon dioxide ($SiO_2$), titanium dioxide ($TiO_2$), and alumina ($Al_2O_3$).

12. The method of manufacturing, as recited in claim 1, wherein the spacer layer is made of magnesium oxide (MgO).

13. The method of manufacturing, as recited in claim 12, wherein the layer is further made of a thin layer of magnesium (Mg).

14. The method of manufacturing, as recited in claim 1, wherein the spacer layer is made of a material selected from a group consisting of: aluminum oxide ($Al_2O_3$), titanium dioxide ($TiO_2$), AlO, $CrO_2$, and germanium (Ge).

15. The method of manufacturing, as recited in claim 1, wherein the fixed layer is made of a material selected from a group consisting of: cobolt iron (CoFe), iron (Fe), iron nickel (FeNi), iron cobolt nickel (FeCoNi), iron plantinum (FePt), $Fe_3Pt$, cobolt plantinum (CoPt), $Co_3Pt$, multi-layers of cobolt and palladium $[Co/Pd]_n$, and cobolt nickel $[Co/Ni]_n$.

16. The method of manufacturing, as recited in claim 15, wherein the fixed layer is further made of a material selected from a group consisting of: Boron (B), nitrogen (N), carbon (C), silicon (Si) or any other element that has low solubility in the foregoing elements.

17. The method of manufacturing, as recited in claim 1, wherein the composite free layer is made of a material selected from a group consisting of: chemically ordered L10 phase FePt, CoPt, chemically ordered bct-structured FeCo, ordered Fe16N2, [Co/Pt]n an [Co/Pd]n where 'n' is an integer.

18. The method of manufacturing, as recited in claim 1, further including a pinning layer formed on top of the fixed layer and below the top electrode.

19. The method of manufacturing, as recited in claim 18, wherein the pinning layer is made of a material selected from a group consisting of: iridium manganese (IrMn), Platinum manganese (PtMn), and nickel manganese (NiMn).

20. The method of manufacturing, as recited in claim 1, further including (001) crystalline structured MgO layer formed between the bottom electrode and the seed layer.

21. The method of manufacturing, as recited in claim 1, further forming a (002) textured underlayer formed between the seed layer and the bottom electrode.

22. The method of manufacturing, as recited in claim 1, wherein the spacer layer is made of copper (Cu) or aluminum (Al).

23. A method of manufacturing a magnetic memory element comprising:
    depositing a seed layer on top of a bottom electrode;
    depositing a first free sub-layer on top of the seed layer, the seed layer being made of a material selected from a group consisting of: rhodium aluminum (RuAl), TiN, CrW, CrX (X being either tungsten (W), and aluminum (Al);
    depositing a nano-current-channel (NCC) layer on top of the first free sub-layer;
    depositing a second free sub-layer on top of the NCC layer, the first free sub-layer, the NCC layer and the second free sub-layer forming a composite free layer, the first and second free sub-layers being made of the same material, grains of a substantially cylindrical shape dispersed throughout the NCC layer and surrounded by a matrix, the composite free layer responsive to a current and when the current is applied to and flows bidirectionally through the layers of the magnetic memory element, the first free sub-layer and the second free sub-layer being exchange coupled to the grains, each of the grains having a magnetic moment and the magnetic moment of each of the grains switching locally and within the grain when switching current flows through the magnetic memory element thereby reducing the switching current, the grains made of a conducting material having high spin polarization ratio and being magnetically soft;
    forming a spacer layer on top of the composite free layer; and
    forming a fixed layer formed on top of the spacer layer on top of which is formed a top electrode.

24. The method of manufacturing, as recited in claim 23, further including (001) crystalline structured MgO layer formed between the bottom electrode and the seed layer.

25. The method of manufacturing, as recited in claim 23, further forming a (002) textured underlayer formed between the seed layer and the bottom electrode.

26. The method of manufacturing, as recited in claim 23, wherein the spacer layer is made of MgO.

27. The method of manufacturing, as recited in claim 23, wherein the spacer layer is made of copper (Cu) or aluminum (Al).

28. The method of manufacturing, as recited in claim 23, wherein the fixed layer and the composite free layer each have perpendicular magnetocrystalline anisotropy.

29. The method of manufacturing, as recited in claim 23, wherein the second free sub-layer is non-nickel based.

30. The method of manufacturing, as recited in claim 23, wherein the top and bottom electrodes are each made of copper (Cu) or aluminum (Al).

31. The method of manufacturing, as recited in claim 23, wherein each of the first and second free sub-layers is made of an alloy selected from a group consisting of: cobolt iron (CoFe), iron (Fe), iron nickel (FeNi), iron cobolt nickel (FeCoNi), iron plantinum (FePt), $Fe_3Pt$, cobolt plantinum (CoPt), $Co_3Pt$, and multi-layers of cobolt and palladium.

32. The method of manufacturing, as recited in claim 30, wherein each of the first and second free sub-layers is further made of a material selected from a group consisting of:
    Boron (B), nitrogen (N), carbon (C), and silicon (Si).

33. The method of manufacturing, as recited in claim 23, wherein the grains are made of magnetically soft material.

34. The method of manufacturing, as recited in claim 23, wherein the matrix is made of an insulating material.

35. The method of manufacturing, as recited in claim 23, wherein the grains are made of iron silicon (FeSi).

36. The method of manufacturing, as recited in claim 23, wherein the matrix is made of silicon dioxide ($SiO_2$).

37. The method of manufacturing, as recited in claim 23, wherein the NCC layer is made of a material selected from a group consisting of: magnesim oxide (MgO), silicon dioxide ($SiO_2$), titanium dioxide ($TiO_2$), and alumina ($Al_2O_3$).

* * * * *